US005609775A

United States Patent [19]
Liu

[11] Patent Number: 5,609,775
[45] Date of Patent: Mar. 11, 1997

[54] DRY ETCH PROCESS FOR TITANIUM-TUNGSTEN FILMS

[75] Inventor: Lianjun Liu, Singapore, Singapore

[73] Assignee: Chartered Semiconductor Manufacturing Pte Ltd., Singapore, Singapore

[21] Appl. No.: 405,718

[22] Filed: Mar. 17, 1995

[51] Int. Cl.$^6$ .................................................. H01L 21/02
[52] U.S. Cl. .......................... 216/77; 156/643.1; 216/41; 216/67; 216/72; 216/75; 216/79
[58] Field of Search .................... 156/643.1, 646.1; 216/75, 77, 78, 79, 41, 72, 67

[56] References Cited

U.S. PATENT DOCUMENTS

| | | | |
|---|---|---|---|
| 4,375,385 | 3/1983 | Halon | 156/643.1 |
| 4,917,759 | 4/1990 | Fisher et al. | 156/643.1 |
| 4,980,018 | 12/1990 | Mu et al. | 156/643 |
| 4,997,520 | 5/1991 | Jucha et al. | 156/643 |
| 5,211,804 | 5/1993 | Kobayashi | 156/665 |

*Primary Examiner*—T. Tung
*Attorney, Agent, or Firm*—George O. Saile

[57] ABSTRACT

A method for dry etching a composite metal film, consisting of an aluminum overlay film, a titanium—tungsten film, and a titanium underlay film, is described. The process uses an organic photoresist as a mask and features improved etch selectivity and non-tapered sidewalls. The addition of $CF_4$, to the etching chemistry used to pattern titanium—tungsten films, increases the selectivity between the photoresist and titanium—tungsten, allowing for thinner resists to be used, and thus finer resolution to be achieved. The introduction of N2 to the etching chemistry results in a $N_2$ containing polymer to be formed during the etching procedure, on the sidewalls of the etched structure. The polymer prevents the isotropic component of the reactive ion etching process to attack the metal structure, thus allowing for non-tapered structures to be obtained.

22 Claims, 4 Drawing Sheets

DRY ETCH PROCESS FOR TITANIUM-TUNGSTEN FILMS

BACKGROUND OF THE INVENTION (1) Field of the Invention

The present invention relates to a fabrication process for semiconductor integrated circuits, and more specifically to the dry etching of titanium-tungsten films that are used as part of the integrated circuit.

(2) Description of Prior Art

The trend in the semiconductor industry has been an ongoing increase in circuit density, while the cost of advanced semiconductor chips decrease. This has been accomplished in part by the ability of the semiconductor engineering community to decrease critical chip dimensions, and thus produce more circuits per chip. The major factor in the reduction of feature size has been the continued development of photolithographic equipment and materials. Advances in cameras, as well as the creation of more sensitive photoresists have allowed critical chip features to be reduced. The steady development of reactive ion etching tools and processes, enabling the small critical images in photoresist to be transferred to the underlying layers, have also played a major role in chip size and cost reduction.

However specific semiconductor processes and materials, that have been used in the past for chip manufacturing, are now not as compatible with the smaller chip features as they once were when larger dimensions were being used. For example aluminum, or aluminum based metallizations, have been an industry standard for all levels of interconnects. However the decreasing features may suggest a change to a different metallization process. If a contact hole to a silicon device region, or a via hole between two levels of wiring, is drastically reduced in size, the use of aluminum may result in electromigration failures. The current density of the aluminum in the narrow opening may become so large that metal migration occurs. Another shortcoming of aluminum, in reference to smaller device or via holes, is the difficulty in filling these openings, with standard aluminum deposition techniques, particularly when the aspect ratio is high. Therefore the industry has looked to other metallization processes to accomadate the advancement to chip miniturazation.

The use of refractory metals, such as tungsten, or alloys of tungsten, such as titanium—tungsten, (TiW), are now being developed and used, in combination with, or as a replacement of aluminum, as described by Marangon, in U.S. Pat. No. 5,407,861. One major advantage of tungsten or TiW, is the ability to withstand very high current densities without the risk of electromigration failure. Therefore even with submicron dimensions, the current density in these contact or via holes, when using refractory metallizations, would not present a problem. Also chemical vapor deposition processes can be employed to deposit these films, thus resulting in a more conformal deposition than the marginal conformality resulting from the evaporated aluminum process. In addition to the electromigration resistance advantages offered by tungsten or TiW, another major advantage is the absence of aluminum penetration into the device region when used as the contact device metallization. When these refractories are used as the underlying layer for an aluminum—TiW metalization, they will prevent aluminum from reaching and penetrating the silicon device region. Thus the direction to refractory contact metallizations, in place of aluminum, has occurred.

One area needed to be developed to accommodate refractory metallizations is the etching or patterning of this metallization. Solutions have been offered. U.S. Pat. No. 4,980,018 by Mu et al, and U.S. Pat. No. 4,997,520 by Jucha et al, show processes that enable the reactive ion etching of tungsten to be accomplished. However applications in which composites of overlying aluminum and underlying TiW, are to be patterned, with the use of photoresist as a mask, are not disclosed. When plasma etching these composites, and using photoresist as the defining pattern, undercutting or tapering can occur. In addition selectivity between the masking photoresist and the composite metals can be low, sometimes resulting in severe erosion of the photoresist image during the etching procedure. Therefore the purpose of this invention is to achieve the desired profile in a aluminum—TiW layer, without undercutting or tapering, when using photoresist as the mask.

SUMMARY OF THE INVENTION

It is an object of this invention to provide a method for the reactive ion etching of metal films to be used for the manufacturing of semiconductor integrated circuits.

It is another object of this invention to provide a method of reactive ion etching metal films or alloys, such as aluminum, titanium—tungsten, and titanium, resulting in a non-tapered profile, or without undercut in regards to the overlying masking material.

It is still another object of this invention to provide a method for the reactive ion etching of metal films or alloys, using photoresist as a mask.

In accordance with this present invention a method is described for the reactive ion etching of an aluminum, titanium—tungsten, titanium, composite film, comprising the steps of: on a semiconductor substrate, having the desired circuit configuration, depositing titanium, titanium—tungsten and aluminum; using standard photolithographic processing to form the desired pattern in the overlying photoresist; using reactive ion etching to transfer the desired pattern in the overlying photoresist to the underlying layers of aluminum, titanium—tungsten, and titanium, via a gas mixture of $BCl_3$, $Cl_2$ and $N_2$ for aluminum and $SF_6$, $BCl_3$, $Cl_2$, $CF_4$ and $N_2$ for the titanium—tungsten and titanium; and using standard processing to remove the masking photoresist and the polymer, formed on the sidewall of the etched metal structure.

BRIEF DESCRIPTION OF THE DRAWING

The object and other advantages of this invention are best explained in the preferred embodiment with reference to the attached drawings that include.

DESCRIPTION OF THE PREFERRED EMBODIMENTS

The method of obtaining non-tapered metal structures, via the use of an enhanced reactive ion etching process, used for contact or interlevel connect metallizations on semiconductor substrates, and containing titanium—tungsten films, as part of the metal structure, will now be described in detail.

Figure 1:
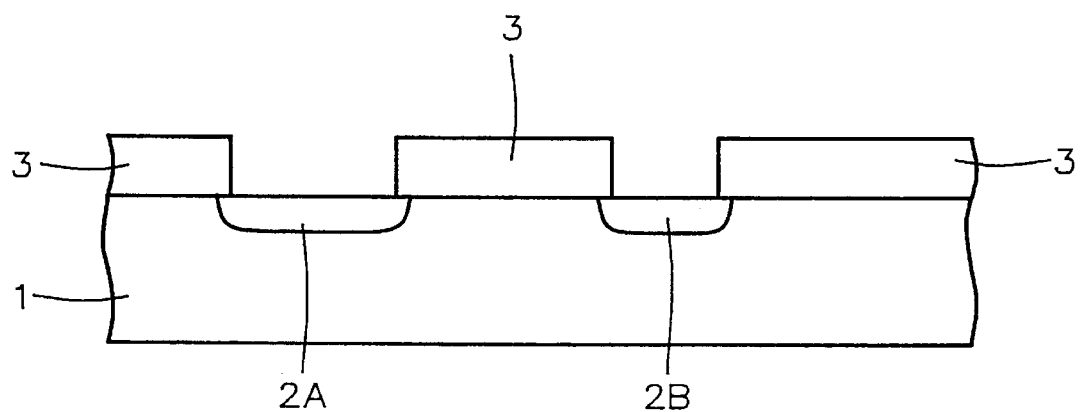
FIG. 1–3, schematically illustrating the cross-sectional representation of the fabrication steps and stages prior to the reactive ion etching of the metallurgy.

FIG. 1 briefly illustrates the steps used in the fabrication sequence of a semiconductor device, up to the point of the deposition of the metallurgy. In FIG. 1 a silicon substrate, 1, with active device regions, 2a and 2b, to be subsequently contacted by metallization, are shown. The active device regions were formed by patterning a silicon dioxide film to obtain silicon dioxide islands, 3. These islands were in turn used as a mask to create the active device regions, via conventional diffusion or ion implantation techniques. It should be noted that the contact hole to device region 2b, is considerably smaller than the contact hole to device region 2a. The diameter of the contact hole to device region 2b is about 0.5 uM, while the dimension of the contact hole to device region 2a is greater than 1.0 uM.

Figure 2:
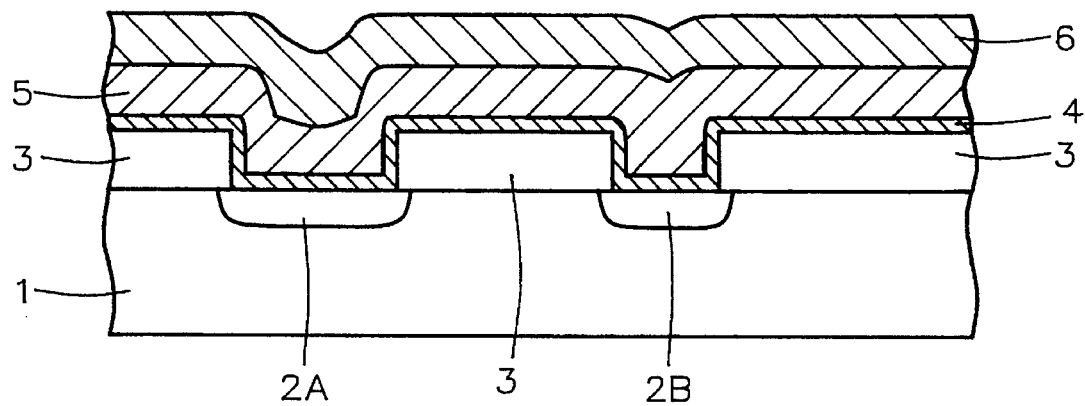

Next a metallization, consisting of a composite of titanium, titanium—tungsten, and aluminum is deposited and shown schematically in FIG. 2. First, after a careful wet cleaning procedure applied to the device regions, 2a and 2b, and the silicon dioxide islands, 3, a film of titanium, 4, is deposited via sputtering or physical vapor deposition, (PVD), to a thickness of about 400 Angstroms. The titanium serves a dual purpose. First, the adhesion between the titanium and the underlying oxide is excellent. Without this adhesive layer the subsequent titanium—tungsten film would have difficulty in avoiding peeling from the underlying oxide, during subsequent device processing. In addition, titanium reduces any native oxide that may exist on the surface of device regions 2a and 2b, thus enabling lower contact resistance to be achieved, than would have existed with a titanium—tungsten interface. Next a layer of titanium—tungsten, (TiW), 5, is sputtered, insitu with the previous titanium layer. The TiW is sputtered using a target of 10% Ti and 90% W. The thickness of this deposited alloy is between about 1000 to 2000 Angstroms. It should be noted that in small contact areas, such as the contact hole to device region 2b, the TiW completely fills the hole by deposition on the sides of the hole, as well as filling from the bottom. This is one of the major advantages of TiW, since all the current has to pass through this small contact opening, a large current density would exist. The outstanding current carrying characteristics of TiW allow for high current densities to be used without the threat of electromigration failures. If aluminum were used, instead of TiW, the conformal coating capabilities of the deposited aluminun may not result in aluminum completely filling the contact hole. Also, if aluminum did completely fill the small opening to device region 2b, the current density in the hole may be too great for aluminum, and thus reliability failures, in the form of electromigration could occur. Another advantage of TiW, in contrast to aluminum, is the ability of TiW to protect against aluminum penetration into the active silicon device regions, 2a and 2b. However the resistivity of the sputtered TiW is about 60 u-ohm-cm and thus to further reduce the resistance of the total metal composite, a film of aluminum, 6, is deposited using PVD to a thickness of about 5000 Angstroms.

Figure 3:
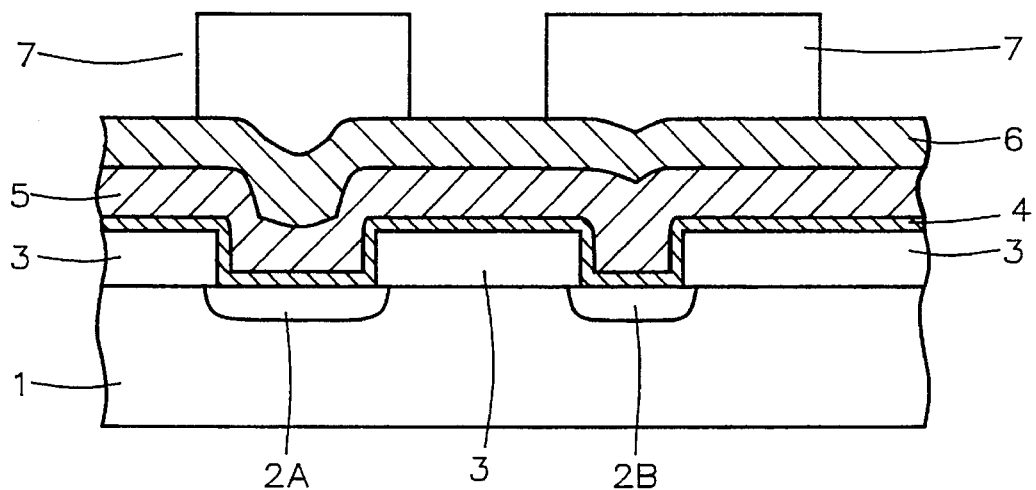
Figure 4:
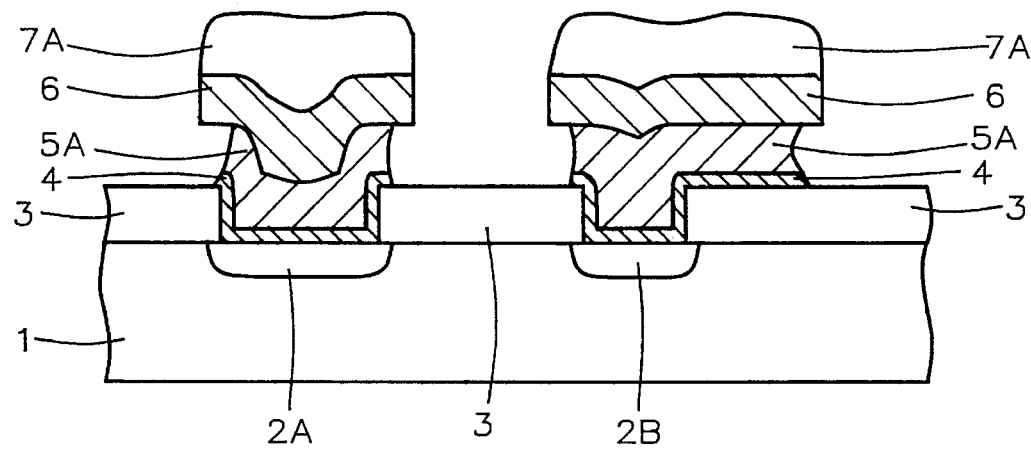
FIG. 4, schematically representing the tapered profile resulting from a reactive ion etching process without the use of $N_2$ and $CF_4$ as part of the etching gas mixture.

FIG. 3 shows the result of standard photolithographic processing, used to define the desired pattern, 7, in the organic photoresist. As a consequence the exposed regions of the composite metallization, not covered by the overlying photoresist image, 7, will not be subsequently removed by the following reactive ion etching process. FIG. 4 schematically shows the result of a reactive ion process used to dry etch the composite aluminum, TiW, titanium layer. The aluminum, 6, was etched using 30 sccm of $BCl_3$, 50 sccm of $Cl_2$, and 10 sccm of $N_2$, at a pressure of 7 mTorr., and at a temperature of between about 55° to 60° C. It can be seen that the resulting aluminum pattern, 6, is not undercut, and without a severe taper, in reference to the masking photoresist image, 7a. However the etching of the TiW, 5a, in 40 sccm of $SF_6$, 20 sccm of $BCl_3$, and 10 sccm of $Cl_2$, at a pressure of 6 mTorr and at a temperature of between about 55° to 60° C., resulted in severe undercutting, in respect to the overlying aluminum, 6, and masking photoresist image, 7a. This is a result of the isotropic component of the etching process, using this specific chemistry. The unprotected sides of the TiW structure, 5a, are attacked during the final stages of the TiW etching. In addition, this etch chemistry also attacked the masking photoresist, 7a, due to the poor selectivity between the photoresist an TiW. For these reactive ion etch conditions the etch ratio of photoresist to TiW was 2 to 1, therefore 10,000 Angstroms of photoresist is consumed or erroded due to the etching of 5,000 Angstroms of TiW. The final titanium etch, using the same conditions and chemistry as used for the TiW etch procedure, increase both the undercut of TiW, 5a, as well as the erosion of the masking photoresist, 7a.

Figure 5:
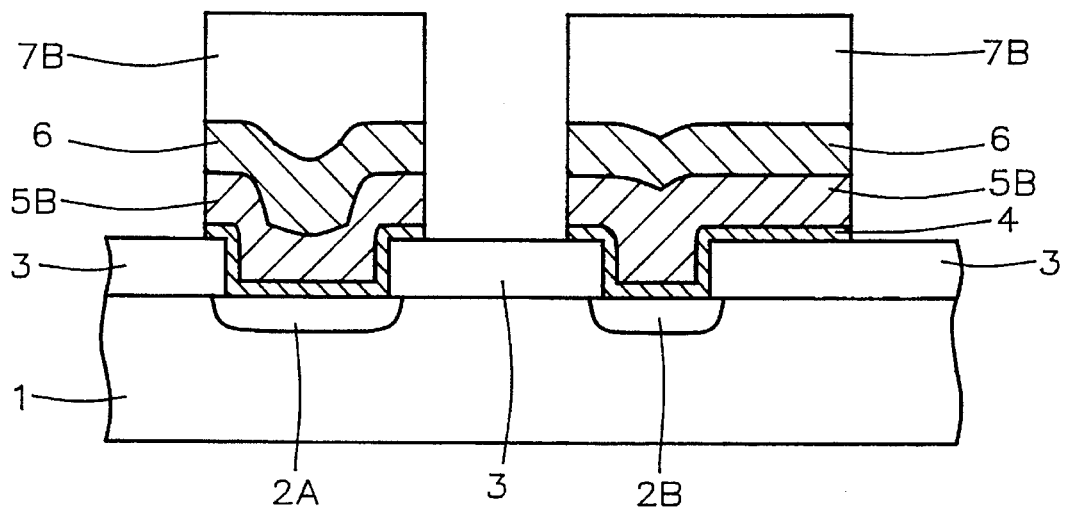
FIG. 5, schematically representing the non-tapered structure obtained via use of a reactive ion etch process which included $N_2$ and $CF_4$ as part of the etching gas mixture.

FIG. 5 shows the result of a specific reactive ion etch chemistry, introduced in this invention, on the final profile of an TiW structure. Again, as shown in FIG. 4, photoresist, 7b, is used as the mask, and again the desired image in the resist is transferred to aluminum, 6, using identical conditions as previously described for FIG. 4. However the gas mixture now used for the TiW dry etching includes about 30 sccm of $CF_4$, and 10 sccm of $N_2$, in addition to 30 sccm of $SF_6$, 20 sccm of $BCl_3$, and 20 sccm of $Cl_2$.

Figure 6:
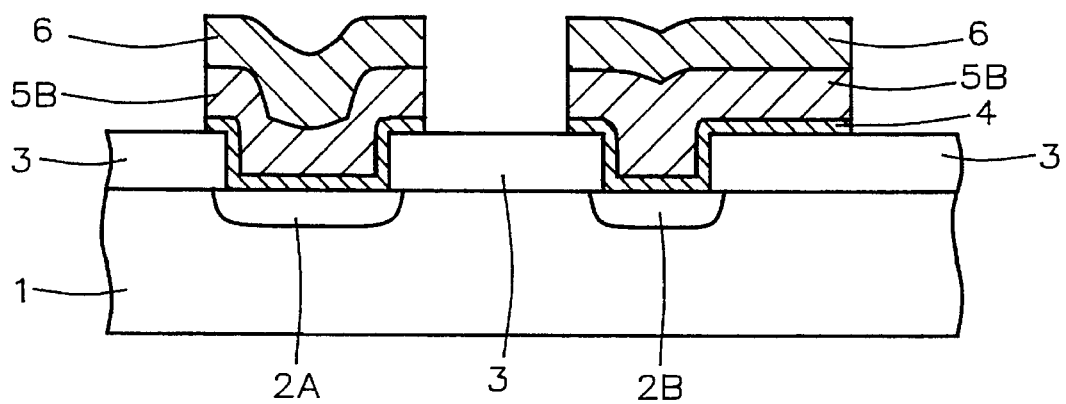
FIG. 6, illustrating schematically the final metal structure and profile, when used as a contact metallurgy.

First the addition of $CF_4$ allows for a etch ratio of photoresist to TiW to increase to one to one, thus avoiding the severe errosion of photoresist that previusly existed when the etching mixture did not include CF4. This also allows for thinner resist layers to be used, and thus finer resolutions can be realized. Of extreme importance is the addition of $N_2$ to the reactive ion etch gas mixture, for the dry etching of TiW. During any plasma etching procedure an isotropic component exists that can result in undercutting of the etched material, in relation to the overlying mask, leaving a final structure that is tapered. The use of $N_2$ for this etching process results in the formation of a polymer, during the etching procedure, that contains some % $N_2$, along with other elements such as chlorine, carbon, hydrogen, etc. This polymer, on the sidewall of the etched structure, prevents the attack of the isotropic component of the reactive ion etch process, to the exposed sides of the TiW, 5b, thus enabling straight walled or non-tapered, non-undercut structures to be achieved. This is shown schematically in FIG. 5. This etch chemistry, $SF_6$, $BCl_3$, $Cl_2$, $CF_4$ and $N_2$ is also used to etch the thin titanium layer, 4. The reactive ion etch procedure is carried out at a temperature of between about 55° to 60° C., and at a pressure of about 6 mTorr. The removal of the photoresist and the sidewall polymer is carried out at a temperature of about 65° C., in oxygen, and shown in FIG. 6.

Figure 7:
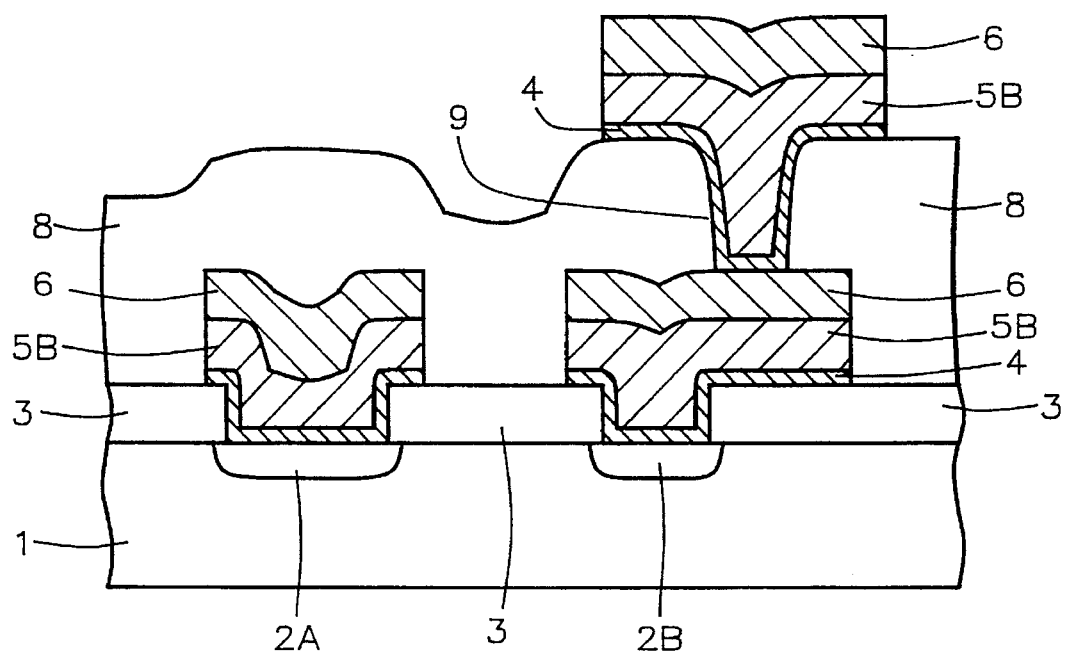
FIG. 7, illustrating schematically the final metal structure and profile, when used as an interlevel connect metallization.

This composite metallurgy can also be used for interlevel and interconnect wiring as shown in FIG. 7. The reactive ion etching conditions and gas etch chemistries would be identical to those described and shown for FIG. 5. Briefly a layer of plasma enhanced chemically vapor deposited silicon oxide, 8, is deposited at a temperature of about 400° C., to a thickness of about 10,000 Angstroms. Standard photolithography and via etching is performed to open via, 9, to the underlying contact metallury. The composite metallury of titanium, TiW, and aluminum, is again deposited using conditions identical to those previously shown. Again it can be seen that the TiW completely fills the via, thus avoiding possible electromigration problems that may have occurred if the via was filled with aluminum. After standard photolihography processing, used to define the desired pattern of the interlevel metallization, the reactive ion etch process, as described previously for FIG. 5, is again used. The reactive ion etch conditions, using the gas mixture of $SF_6$, $BCl_3$, $Cl_2$, $CF_4$ and $N_2$, again results in non-tapered TiW metal structures.

It should be noted that this invention, "Dry Etch Process for Titanium—Tungsten Films" although not shown as part of any specific device application can be used for, the fabrication of NFET, (n-type field effect transistors), PFET, as well as for CMOS, (complimentary metal oxide semiconductor), BiCMOS, (bipolar-CMOS), as well as for specific bipolar transistor applications.

While this invention has been particularly shown and described with reference to the preferred embodiments thereof, it will be understood by those skilled in the art that various changes in form and details may be made without departing from the spirit and scope of this invention.

What is claimed is:

1. A method for forming metal patterns on a semiconductor substrate comprising the steps of:

depositing a first composite metal film, composed of a titanium underlay film, a titanium—tungsten film, and a aluminum overlay film, on said substrate;

forming a first organic photoresist image on part of said first composite metal film;

anisotropically etching the exposed part of said first composite metal, to form a specific metal shape, using an etching mixture comprising $CF_4$ and $N_2$ for the titanium underlay film and the titanium—tungsten film;

removing said first organic photoresist;

depositing a first dielectric insulator film on said first composite metal shape and said substrate;

using photolithography and etching, to open a via in said first dielectric insulator film, to said first composite metal shape;

depositing a second composite metal film, composed of a titanium underlay film, a titanium—tungsten film, and a aluminum overlay film, on said first dielectric insulator film and on said first composite metal shape, in said opened via;

forming a second organic photoresist image on part of said second composite metal film;

anisotropically etching the exposed part of said second composite metal, to form a specific metal shape, using an etching mixture comprising CF and N for the titanium underlay film and the titanium—tungsten film; and removing said second organic photoresist.

2. The method of claim 1 wherein said titanium underlay film, of said first composite metal, is about 400 Angstroms.

3. The method of claim 1 wherein said titanium—tungsten film, of said first composite metal, is about 1500 Angstroms, and composed of between about 5 to 15% titanium, and between about 85 to 95% tungsten.

4. The method of claim 1 wherein said aluminum overlay film, of said first composite metal, is about 5000 Angstroms.

5. The method of claim 1 wherein etching of the aluminum overlay film is carried out with an etching mixture of about 30 sccm of $BCl_3$, about 50 sccm of $Cl_2$, and about 10 sccm of $N_2$.

6. The method of claim 1 wherein the etching mixture for said titanium—tungsten film is about 30 sccm of $SF_6$, about 20 sccm of $BCl_3$, about 20 sccm of $Cl_2$, about 30 sccm of $CF_4$, and about 10 sccm of $N_2$.

7. The method of claim 1 wherein the etching mixture for said titanium underlay film is about 30 sccm of $SF_6$, about 20 sccm of $BCl_3$, about 20 sccm of $Cl_2$, about 30 sccm of $CF_4$, and about 10 sccm of $N_2$.

8. The method of claim 1 wherein said anisotropic etching, of said first composite metal, is performed using said first photoresist as a mask.

9. The method of claim 1 wherein said titanium underlay film, of said second composite metal is about 400 Angstroms.

10. The method of claim 1 wherein said titanium—tungsten film, of said second composite metal is about 1500 Angstroms, composed of between about 5 to 15% titanium and between about 85 to 95% tungsten.

11. The method of claim 1 wherein said aluminum overlay film, of said second composite metal, is about 8000 Angstroms.

12. The method of claim 1 wherein the said anisotropic etching of the said second composite metal is performed using said second photoresist as a mask.

13. A method for forming metal patterns on a semiconductor substrate comprising the steps of:

depositing a first composite metal film, composed of a titanium underlay film, a titanium—tungsten film, and a aluminum overlay film, on said substrate;

forming a first organic photoresist image on part of said first composite metal film;

anisotropically etching the exposed part of said first composite metal, to form a specific metal shape, using an etching mixture comprising $BCl_3$, $Cl_2$, and $N_2$ for said aluminum overlay film, and an etching mixture comprising $SF_6$, $BCl_3$, $Cl_2$, $CF_4$, and $N_2$ for said titanium—tungsten film, and said titanium underlay film;

forming a $N_2$ containing polymer, on the sides of said first composite metal film, during the anisotropic etching of said first composite metal film;

removing said first organic photoresist and said polymer;

depositing a first dielectric insulator film on said first composite metal shape and on said substrate;

forming a via hole, in said first dielectric insulator film, to said first composite metal shape;

depositing a second composite metal film, composed of a titanium underlay film, a titanium—tungsten film, and a aluminum overlay film, on said first dielectric and on said first composite metal shape, in said opened via;

forming a second photoresist image on part of said second composite metal film;

anisotropically etching the exposed part of second composite metal, to form a specific metal shape, using an etching mixture comprising $BCl_3$, $Cl_2$, and $N_2$ for the said aluminum overlay, and an etching mixture comprising $SF_6$, $BCl_3$, $Cl_2$, $CF_4$, and $N_2$ for the titanium—tungsten film, and for the said titanium underlay film;

forming a $N_2$ containing polymer, on the sides of said second composite metal film, during the anisotropic etching of said second composite metal film; and removing said second organic photoresist and said polymer.

14. The method of claim 13 wherein said titanium underlay film, of said first composite metal, is about 400 Angstroms.

15. The method of claim 13 wherein said titanium—tungsten film, of said first composite metal, is about 1500 Angstroms, and composed of between about 5 to 15% titanium, and between about 85 to 95% tungsten.

16. The method of claim 13 wherein said aluminum overlay, of said first composite metal, is about 5000 Angstroms.

17. The method of claim 13 wherein the etching mixture for said aluminum overlay film is about 30 sccm of $BCl_3$, about 50 sccm of $Cl_2$, and about 10 sccm of $N_2$.

18. The method of claim 13 wherein the etching mixture for said titanium—tungsten film is about 30 sccm of $SF_6$, about 20 sccm of $BCl_3$, about 20 sccm of $Cl_2$, about 30 sccm of $CF_4$, and about 10 sccm of $N_2$.

19. The method of claim 13 wherein the etching mixture for said titanium underlay is about 30 sccm of $SF_6$, about 20 sccm of $BCl_3$, about 20 sccm of $Cl_2$, about 30 sccm of $CF_4$, and about 10 sccm of $N_2$.

20. The method of claim 13 wherein said anisotropic etching, of said first composite metal, is performed using said first photoresist as a mask.

21. The method of claim 13 wherein the etch rate ratio of said photoresist to said titanium—tungsten film is about one, and said etching mixture is of about 30 sccm of $SF_6$, about 20 sccm of $BCl_3$, about 20 sccm of $Cl_2$, about 30 sccm of $CF_4$, and about 10 sccm of $N_2$.

22. The method of claim 13 wherein said $N_2$ containing polymer is formed on the sides of said first composite metal film during the said anisotropic etching of said first composite metal film, using an etching mixture of about 30 sccm $BCl_3$, about 50 sccm of $Cl_2$, and about 10 sccm of $N_2$, for the said aluminum overlay film, and about 30 sccm of $SF_6$, about 20 sccm of $BCl_3$, about 20 sccm of $Cl_2$, about 30 sccm of $CF_4$, and about 10 sccm of $N_2$, for the said titanium—tungsten film and for the said titanium underlay film.

* * * * *